United States Patent
Smith et al.

(10) Patent No.: US 12,259,871 B2
(45) Date of Patent: Mar. 25, 2025

(54) SIGNAL PROCESSING FOR MULTI-SENSOR GROUPS

(71) Applicant: Aclima Inc., San Francisco, CA (US)

(72) Inventors: Andrew Smith, San Francisco, CA (US); Davida Herzl, San Francisco, CA (US)

(73) Assignee: Aclima Inc., San Leandro, CA (US)

( * ) Notice: Subject to any disclaimer, the term of this patent is extended or adjusted under 35 U.S.C. 154(b) by 0 days.

(21) Appl. No.: 18/333,782

(22) Filed: Jun. 13, 2023

(65) Prior Publication Data

US 2024/0004865 A1    Jan. 4, 2024

Related U.S. Application Data (63) Continuation of application No. 17/558,240, filed on Dec. 21, 2021, now Pat. No. 11,720,544, which is a continuation of application No. 16/383,468, filed on Apr. 12, 2019, now Pat. No. 11,238,028.

(51) Int. Cl.
| | |
|---|---|
| *G06F 13/20* | (2006.01) |
| *G01R 33/54* | (2006.01) |
| *G06F 16/23* | (2019.01) |
| *G06F 16/245* | (2019.01) |

(52) U.S. Cl.
CPC ......... *G06F 16/2365* (2019.01); *G01R 33/54* (2013.01); *G06F 13/20* (2013.01); *G06F 16/245* (2019.01)

(58) Field of Classification Search
CPC ............................... G06F 16/245; G06F 13/20
See application file for complete search history.

(56) References Cited

U.S. PATENT DOCUMENTS

| | | | |
|---|---|---|---|
| 9,528,957 | B2 | 12/2016 | Scheffler |
| 10,054,534 | B1 | 8/2018 | Nourbakhsh |
| 11,009,474 | B2 | 5/2021 | Brahem |
| 11,169,239 | B2 | 11/2021 | Mishra |
| 2004/0158359 | A1 | 8/2004 | Frecska |
| 2005/0061056 | A1 | 3/2005 | Sunshine |

(Continued)

FOREIGN PATENT DOCUMENTS

| | | |
|---|---|---|
| CN | 103994484 | 8/2014 |
| GB | 2536975 | 7/2018 |

(Continued)

*Primary Examiner* — Dangelino N Gortayo
(74) *Attorney, Agent, or Firm* — Van Pelt, Yi & James LLP (57) ABSTRACT

A method and system for processing signals from a plurality of groups of sensors are described. Each group includes a first sensor and at least one additional sensor. A first sensor identifier and first sensor data are received from the first sensor. At least one additional sensor identifier and additional sensor data are also received from the additional sensor(s). The first sensor and the additional sensor(s) of each group are co-located. The first sensor identifier is associated with the additional sensor identifier(s) for each group. Calibration information for the first sensor is obtained based on the first sensor identifier and the additional sensor identifier(s). The calibration information is specific to the first sensor having the first sensor identifier. Corrected first sensor data for each of the groups is provided based on the first sensor data, the additional sensor data and the calibration information.

16 Claims, 6 Drawing Sheets

(56) References Cited

U.S. PATENT DOCUMENTS

| | | | |
|---|---|---|---|
| 2005/0092065 A1 | 5/2005 | Tajima | |
| 2011/0138904 A1 | 6/2011 | Nakaso | |
| 2014/0250975 A1 | 9/2014 | Kane | |
| 2014/0278186 A1 | 9/2014 | Herzl | |
| 2015/0039262 A1 | 2/2015 | Tan | |
| 2015/0153299 A1 | 6/2015 | Chou | |
| 2015/0369656 A1 | 12/2015 | Chen | |
| 2016/0072893 A1* | 3/2016 | Suzuki | H04W 4/38 709/224 |
| 2016/0081597 A1 | 3/2016 | Bhavaraju | |
| 2016/0165193 A1 | 6/2016 | Rasheed | |
| 2016/0370302 A1 | 12/2016 | Briden | |
| 2016/0370338 A1* | 12/2016 | Sayfan | G01N 33/0062 |
| 2017/0160157 A1 | 6/2017 | Chang | |
| 2017/0187783 A1 | 6/2017 | Pogorelik | |
| 2017/0316670 A1* | 11/2017 | Desgorces | B32B 7/12 |
| 2017/0372601 A1 | 12/2017 | Yamashita | |
| 2018/0120278 A1 | 5/2018 | Hoorfar | |
| 2019/0137467 A1 | 5/2019 | Chou | |
| 2019/0324436 A1 | 10/2019 | Cella | |
| 2020/0026585 A1* | 1/2020 | Grundy | G08B 29/06 |
| 2020/0284820 A1 | 9/2020 | Zhang | |
| 2020/0309678 A1 | 10/2020 | Tumpold | |

FOREIGN PATENT DOCUMENTS

| | | |
|---|---|---|
| GB | 2559704 | 8/2018 |
| JP | 2001174373 | 6/2001 |
| JP | 2018128465 | 8/2018 |
| WO | 2013130506 | 9/2013 |
| WO | 2018089674 | 5/2018 |

* cited by examiner

SIGNAL PROCESSING FOR MULTI-SENSOR GROUPS

CROSS REFERENCE TO OTHER APPLICATIONS

This application is a continuation of U.S. patent application Ser. No. 17/558,240, entitled SIGNAL PROCESSING FOR MULTI-SENSOR GROUPS filed Dec. 21, 2021 which is incorporated herein by reference for all purposes, which is a continuation of U.S. patent application Ser. No. 16/383,468 entitled SIGNAL PROCESSING FOR MULTI-SENSOR GROUPS filed Apr. 12, 2019, now U.S. Pat. No. 11,238,028, which is incorporated herein by reference for all purposes.

BACKGROUND OF THE INVENTION

Air quality is a measure of the condition of air relative to the requirements of human need or purpose. Air quality monitoring is performed to measure the levels of pollutants in the air so as to detect potential harmful air pollution. Depending on the application, air quality monitoring systems can be mobile or stationary and can be used in outdoor or indoor settings. Air quality monitoring typically includes detecting and taking measurements of pollutants or contaminants in the air such as nitrogen dioxide ($NO_2$), carbon monoxide (CO), nitrogen oxide (NO), ozone ($O_3$), sulphur dioxide ($SO_2$), carbon dioxide ($CO_2$), volatile organic compound (VOC) and particulate matter. These measurements are performed by various types of environmental sensors, including gas and particulate matters sensors. These environmental sensors are desired to deliver high accuracy measurements at low cost.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A method and system for processing signals from a plurality of groups of sensors are described. Each group includes a first sensor and at least one additional sensor. A first sensor identifier and first sensor data are received from the first sensor. At least one additional sensor identifier and additional sensor data are also received from the additional sensor(s). The first sensor and the additional sensor(s) of each group are co-located. The first sensor identifier is associated with the additional sensor identifier(s) for each group. Calibration information for the first sensor is obtained based on the first sensor identifier and the additional sensor identifier(s). The calibration information is specific to the first sensor having the first sensor identifier. Corrected first sensor data for each of the groups is provided based on the first sensor data, the additional sensor data and the calibration information for the first sensor.

In some embodiments, the calibration information is obtained by searching, for each of the plurality of groups and using the first sensor identifier, a database including calibration table(s) for the first sensor identifier. A correction for the first sensor of each of the plurality of groups is determined using the calibration table, the additional sensor identifier(s) and the additional sensor data. Providing the corrected first sensor data further includes applying the correction to the first sensor data for each group.

Figure 1:
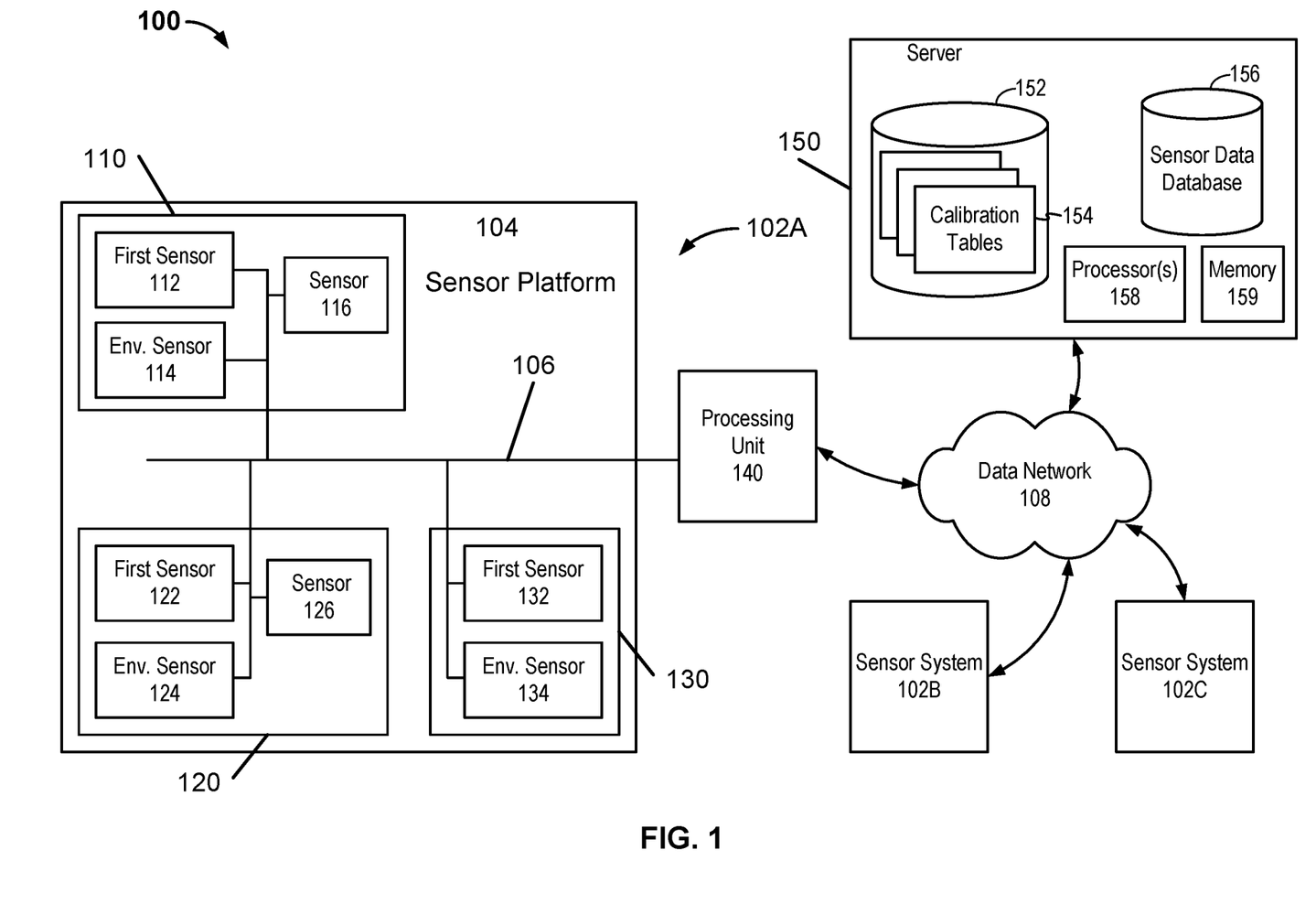
FIG. 1 is a block diagram of a system for sensing and processing data from multi-sensor groups.

FIG. 1 depicts an embodiment of a system 100 for collecting and processing environmental data. System 100 includes multiple sensor systems 102A, 102B, 102C and server 150. Although a single server 150 is shown, multiple servers may be used. Similarly, although three sensor systems 102A, 102B and 102C are shown, another number are typically present. Sensor systems 102A, 102B and 102C communicate with server 150 via a data network 108. The communication may take place wirelessly.

Sensor system 102A, 102B and 102C may be stationary or mobile, for example mounted in a vehicle. Sensor system 102A includes a sensor platform 104 having a bus 106 and multi-sensor groups 110, 120 and 130. A multi-sensor group includes multiple sensors. Group 110 includes sensors 112, 114 and 116; group 120 includes sensors 122, 124 and 126; and group 130 include sensors 132 and 134. Although particular numbers of sensors are shown in each group 110, 120 and 130, another number of sensors might be used. Further, although three groups 110, 120 and 130 of sensors are shown, another number of groups of sensors may be present on sensor platform 104.

Each group 110, 120 and 130 includes multiple sensors that are co-located. Sensors 112, 114 and 116 are co-located. Sensors 122, 124 and 126 are co-located. Sensors 132 and 134 are co-located. Sensors that are co-located sense the same packet of air under substantially the same conditions. In some embodiments, sensors that are co-located are in in close proximity to each other, for example within ten millimeters or less. In some embodiments, sensors that are co-located may be further apart if the sensors sample the same packet of air inside of a closed system, such as a system of closed tubes. Because the sensors in each group 110, 120 and 130 are in co-located, sensors within a group are exposed to substantially the same environment at a particular time. In some embodiments, this corresponds to sensors in a group 110, 120 or 130 being exposed to the same air flow during sensing. For example, sensors 112, 114 and 116 within group 110 are at substantially the same temperature and pressure at a particular time, while sensors 122, 124 and 126 of group 120 can be at a different temperature and/or pressure at the particular time. Sensors that are within a single group 110, 120 or 130 have the same relative humidity and exposed to the same gases or contaminants. For example, sensors 112, 114 and 116 may exposed to the same fraction of $NO_2$, CO, NO, $O_3$, $SO_2$, $CO_2$, VOCs, particulate matter and/or other compounds from the airflow within a particular time interval. This time interval may be not more than two seconds in some embodiments. In some such embodiments, the time interval is not more than one second.

Although sensors within a group 110, 120 and 130 are at substantially the same conditions at a particular time, conditions at one group 110, 120 and 130 may differ from conditions at another group. Stated differently, there may be local variations in temperature and/or pressure across sensor platform 104. Similarly, humidity and/or other aspects of the environment may have local variations across the sensor platform 104. As a result, the temperature, pressure, humidity and/or other condition may be different at sensors 112, 114 and 116 than at sensors 122, 124 and 126 and/or at sensors 132 and 134.

Each group 110, 120 and 130 is considered to include a first sensor 112, 122 and 132, respectively. First sensors 112, 122 and 132 are used to sense air quality and may be of primary interest to a user of system 100. First sensors 112, 122 and 132 may be gas sensors, VOC sensors, particulate matter sensors or other analogous sensors. For example, first sensors 112, 122 and 132 may be used to sense one or more of $NO_2$, CO, NO, $O_3$, $SO_2$, $CO_2$, VOCs, particulate matter and other compounds. In some embodiments, first sensor 112, 133 and/or 132 may be a multi-modality sensor. A multi-modality gas sensor senses multiple gases or compounds. For example, if first sensor 112 is a multi-modality $NO_2/O_3$ sensor, first sensor 112 might sense both $NO_2$ and $O_3$ together. However, sensor 112 cannot separately measure $NO_2$ only or $O_3$ only. In some embodiments, the groups 110, 120 and 130 are configured based upon the requirements of first sensors 112, 122 and 132. For example, if a first sensor 112 requires a particular flow rate of gas, then group 110 may be configured such that gas flows across first sensor 112 in the desired range of flow rate(s). Remaining sensors in the group are used to sense characteristics of the surrounding environment including, in some instances, other gases and/or matter. In some embodiments, at least one of temperature and pressure are sensed by remaining sensors 114 and 116, 124 and 126, and 134 of groups 110, 120 and 130, respectively. For example, first sensor 112 may be a CO sensor, environmental sensor 114 may be a temperature sensor and sensor 116 may be a pressure sensors. In another example, first sensor 112 may be a NO sensor, sensor 114 may be a temperature, pressure and relative humidity (T/P/RH) and sensor 116 may be a particulate matter sensor (or be omitted). In still another example, first sensor 112 may be a multi-modality $NO_2/O_3$ sensor, sensor 114 may be a temperature and pressure (T/P) sensor and sensor 116 may be an $O_3$ sensor.

Groups 110, 120 and 130 of sensor provide sensor data over bus 106. In some embodiments, sensors in groups 110, 120 and 130 incorporate a time updated by a master clock (not shown) in the data. Master clock may reside on sensor platform 104, may be part of processing unit 140, or may be provided from server 150. As a result, groups 110, 120 and 130 may provide timestamped data via bus 106. Optional processing unit 140 may perform some processing and functions for data from sensor platform 104, may simply pass data from sensor platform 104 to server 150 or may be omitted.

Sensor systems 102B and 102C are analogous to sensor system 102A. In some embodiments, sensor systems 102B and 102C have the same components as sensor system 102A. However, in other embodiments, the components may differ. For example, sensor system 102A may have a CO first sensor 112, a particulate matter first sensor 122, a $CO_2$ first sensor 132, T/P/RH environmental sensors 114, 124 and 134 and additional sensors 116 and 126, while sensor system 102B may include CO, a multi-modality $NO_2/O_3$, VOC and $SO_2$ first sensors along with temperature and pressure (T/P) environmental sensors. However, sensor systems 102A, 102B and 102C function in an analogous manner.

Server 150 includes calibration database 152 having calibration tables 154, sensor data database 156, processor(s) 158 and memory 159. Processor(s) 158 may include multiple cores. Processor(s) 158 may include one or more central processing units (CPUs), one or more graphical processing units (GPUs) and/or one or more other processing units. Memory 159 can include a first primary storage, typically a random access memory (RAM), and a second primary storage area, typically a non-volatile storage such as solid state drive (SSD) or hard disk drive (HDD). Memory 159 stores programming instructions and data for processes operating on processor(s) 158. Primary storage typically includes basic operating instructions, program code, data and objects used by processor(s) 158 to perform their functions. Primary storage devices (e.g., memory 159) may include any suitable computer-readable storage media, described below, depending on whether, for example, data access needs to be bi-directional or uni-directional Sensor data database 156 includes data received from sensor systems 102A, 102B and/or 102C. After capture by sensor system 102A, 102B and/or 102C, data stored in sensor data database 156 may be operated on by various analytics and visualized.

Calibration database 152 and calibration tables 154 are used as discussed below to correct sensor data from sensor systems 102A, 102B and 102C. Calibration tables 154 are used to associate calibration information for a sensor with the appropriate environmental and/or other data. Each first sensor 112, 122 and 132 is individually calibrated before use. Additional sensors 114, 116, 24, 126 and 134 may also be individually calibrated. Thus, the variations of individual sensors 112, 114, 116, 122, 124, 126, 132 and/or 134 with surrounding conditions is empirically determined. Calibration database 152 stores the outputs from each of first sensor 112, 122 and 132 under various conditions or corrections obtained from such data. For example, calibration database 152 may store a function, a coefficient or other mechanism used to correct data for sensor 112 based on temperature and pressure data.

Calibration table(s) 154 indicate the identities of individual sensors and their association with other sensors in a particular group. For example, if first sensor 112 is a CO gas sensor, the signal output from first sensor 112 varies not only with the amount of CO but also based on the temperature and pressure (and in some embodiments humidity) at which the data is captured. Environmental sensor 114 is used to obtain such data. Calibration tables 154 store the identities of sensors 112 and 114 and indicate that sensors 112 and 114 are associated. As a result, data from sensor 114 (e.g. temperature and/or pressure) will be used in correcting data from sensor 112 based on the individual calibration of sensor 112. Sensor 116 may be treated in an analogous manner. Similarly, sensors 122 and 126 may be associated with environmental sensor 124. Thus, data from sensor 124, such as temperature, pressure, and/or humidity, may be used to correct data for sensor(s) 122 and 126 based on the individual calibrations of sensors 112 and 126. Sensor 132 may be associated with environmental sensor 134. Thus, data from sensor 134, such as temperature, pressure, and/or humidity, may be used to correct data for sensor(s) 132 based on the calibration of sensor 132. Consequently, calibration tables 154 also indicate that sensors 122 and 126 are associated with sensor 124 and that sensor 132 is associated with sensor 134. In some embodiments, for example if sensor 112 is desired to be further corrected for the presence of other substances, calibration tables 154 also indicate that sensor 112 is associated with sensor 116. In another embodiment, calibration tables may indicate that sensor 112 is associated with both sensors 114 and 116. Thus, the relationships between sensors 112, 114, 116, 122, 124, 126, 132 and 134 is stored in calibration tables 154. In some embodiments, calibration tables 154 also store the corrections for environmental factors such as temperature, pressure and humidity for each sensor.

Figure 2A:
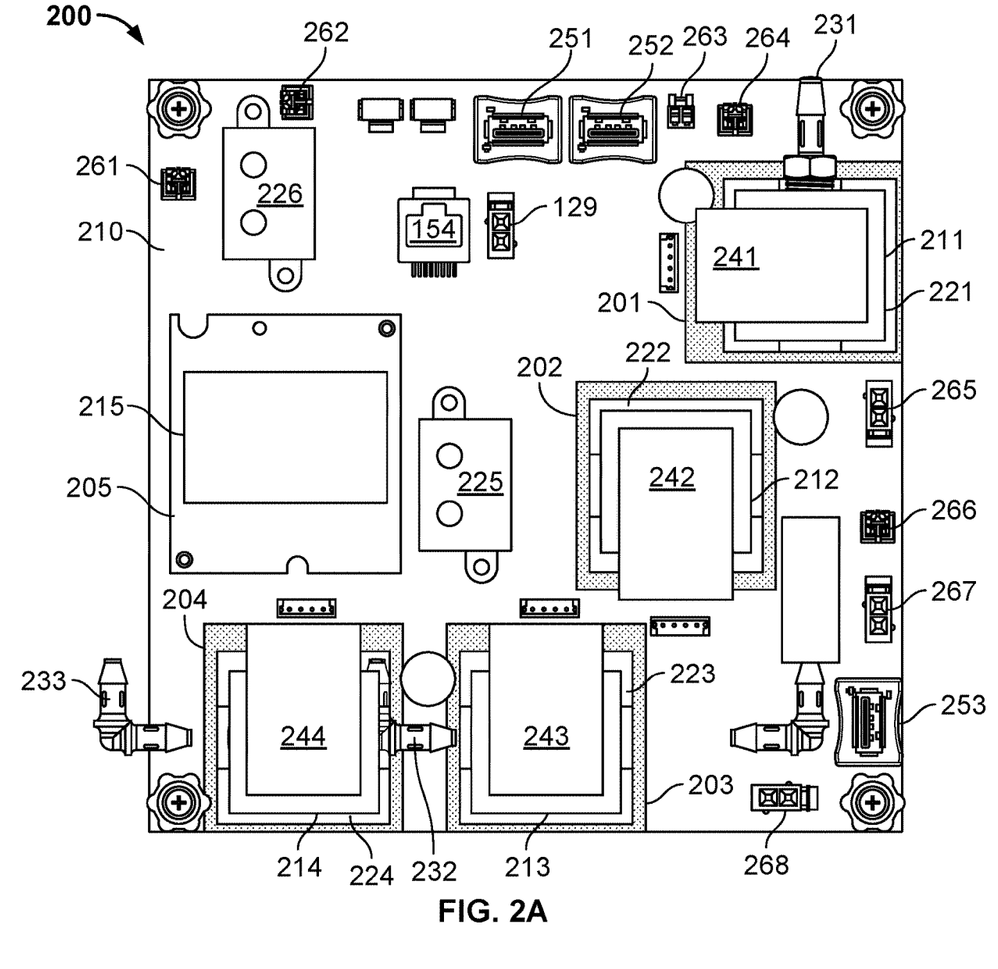
FIGS. 2A and 2B are top and perspective views of one embodiment of a system for sensing environmental quality using multi-sensor groups.
Figure 2B:
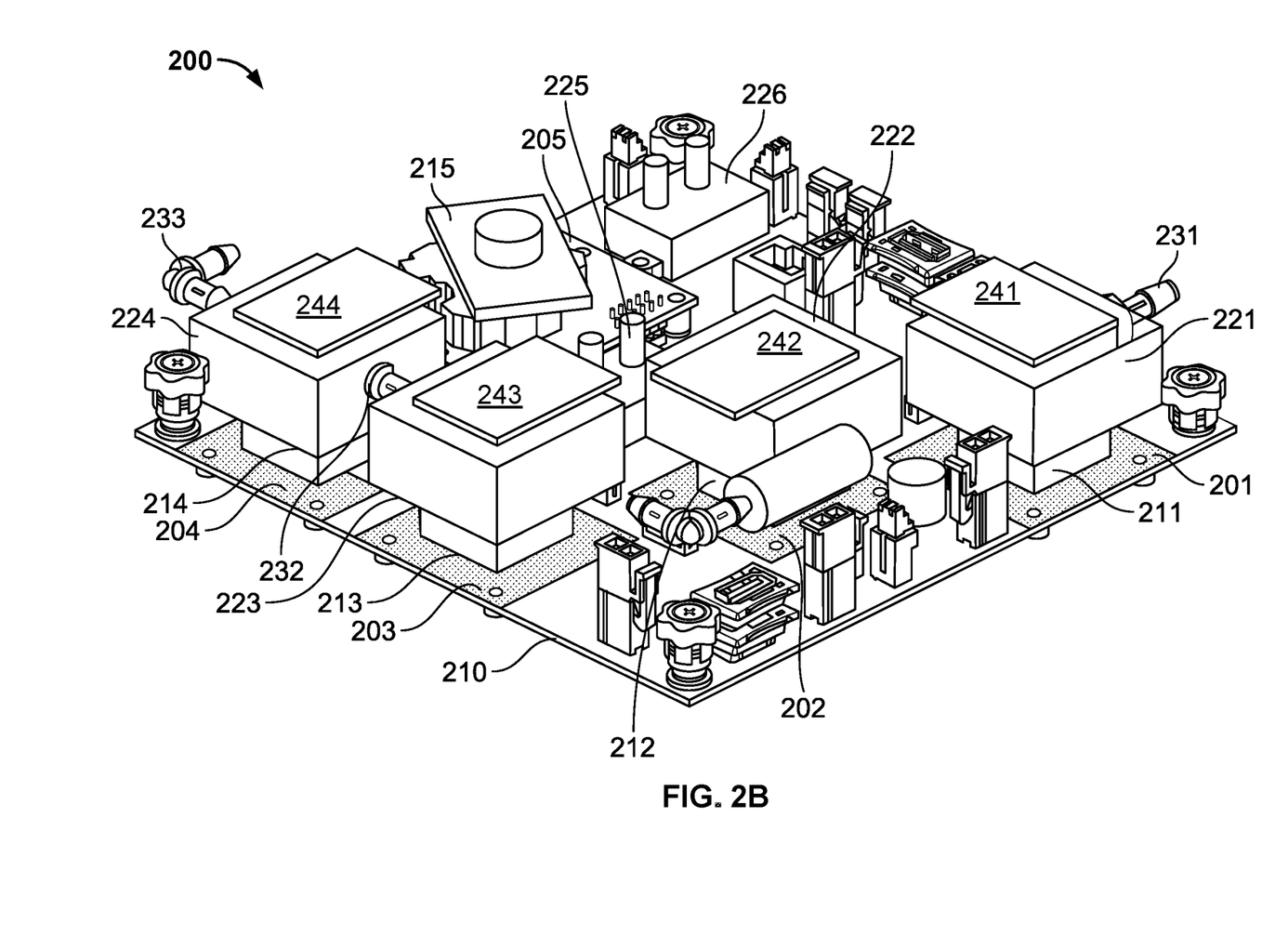

FIGS. 2A and 2B depict top and perspective views of an embodiment of a system 200 for monitoring and collecting environmental data that supports the acquisition of quality measurements of contaminants or pollutants by sensors based on different technologies in an integrated manner. In some embodiments, system 200 is analogous to sensor platform 104 and utilizes groups including multiple sensors. In the example shown, the system includes a primary substrate 210 comprising a plurality of gas sensor modules. In this case, the plurality of sensor modules includes sensor modules depicted at 201, 202, 203, 204 and 205. A sensor module of system 200 is analogous to a group of sensors 110, 120 or 130 of the system 100.

In the embodiment shown, a plurality of gas sensors (depicted at 211, 212, 213, 214, and 215 respectively) are disposed on the primary substrate 210, each gas sensor is part of a sensor module on the primary substrate. In particular, gas sensor 211 is part of gas sensor module 201, gas sensor 212 is included in gas sensor module 202, gas sensor 213 is part of gas sensor module 203, gas sensor 214 is included gas sensor module 204, and gas sensor 215 is part of gas sensor module 205.

In some examples, one or more of the gas sensors (e.g., gas sensor 211, gas sensor 212, gas sensor 213, gas sensor 214, and/or gas sensor 215) disposed on the primary substrate 210 is selected from a group consisting of multi-modality gas sensors. As indicated above, multi-modality sensors are different types of sensors in terms of the type of gas or substance measured (e.g., $NO_2$, CO, NO, $O_2$, $O_3$, $SO_2$, $CO_2$, VOC and particulate matter). In some embodiments, multi-modality sensors also use the different technologies or methodologies of sensor types depending on the type of gas or substances measured. For example, the sensors used might include but are not limited to metal oxide, electrochemical (EC), optical, generic gas sensor (GGS), gas sensitive semiconductor (GSS) which is a type of metal oxide, photoionization detector (PID), and non-dispersive infrared (NDIR)) sensors.

The system 200 as shown in FIGS. 2A-2B provides an ability to integrate different types of devices or sensors on to a single primary substrate (e.g., primary substrate 210). In particular, each sensor module 201, 202, 203, 204 and 205 of FIGS. 2A-2B is configured to couple to a sensor technology type. For instance, a given gas sensor module is configured to couple to a particular sensor technology type such as GGS technology. This configuration provides for the coupling of any generic gas sensor (e.g., for detecting the presence of a particular gas such as nitrogen dioxide, carbon monoxide, or nitrogen oxide) via the gas sensor module to the primary substrate. Alternatively, a given gas sensor module can be configured to couple to a different technology such as PID, NDIR, or GGS. Each of these configurations provides for the coupling of other types of sensors that detect other gases or substances including, for example, volatile organic compounds, carbon dioxide and Temperature/Pressure/Relative Humidity (T/P/RH).

The system further includes one or more device connectors (e.g., power or data connectors) disposed on the primary substrate 210. Each connector is configured to couple or connect a device to the primary substrate 210 or to provide a connection from a sensor module to a data processor, such as processing unit 140 depicted in FIG. 1. In particular, as described in further detail below, the primary substrate 210 includes USB hubs, inputs, or connectors capable of accommodating or connecting almost any sensing device to allow integration of any device capable of parallel or serial data transmission over a wired or wireless protocol. Accordingly, the system is configured to support, control, and integrate data collected from external devices including sensors that may not be physically mounted on the primary substrate 210.

For example, data connectors (e.g., USB connectors depicted at 251, 252, and 253 and Ethernet connector at 254) provide an ability to make a data connection to a data processor or a processing unit (not shown in FIGS. 2A-2B) or to another sensor (e.g., a particulate matter sensor). The data processor or processing unit is configured to receive and process data obtained from various gas sensors and other devices coupled (e.g., electrically or mechanically) to the primary substrate 210. Additionally, power connectors depicted at 261, 262, 263, 264, 265, 266, 267, 268 and 269 are used to provide power to devices (e.g., gas pumps, processors, or sensors). In this manner, the system is configured to electrically couple and to provide data connections to various devices (e.g., USB or Ethernet devices) even if such devices are not mechanically disposed on or physically mounted or coupled directly to the primary substrate 210. In the example shown, the system is configured to provide a data connection to a particulate matter sensor (not shown) via data connector 253 and power to the particulate matter sensor via power connector 268. The system is also configured to provide a data connection to an ozone sensor (not shown) via data connector 254 and power to the ozone sensor via power connector 269. In other embodiments, such sensors may be part of one of the sensor modules included on system 200.

One challenge in monitoring and collecting environmental data, especially in a mobile application, is to obtain a high quality air sample that can be tested and measured appropriately to detect a given pollutant or contaminant that is highly reactive, sensitive, or present in very small trace amounts. In these cases, higher quality measurements will be obtained if the air sample is conditioned and if its flow provided to each gas sensor is controlled.

Accordingly, as shown in FIGS. 2A-2B, system 200 includes a manifold comprising a plurality of flow hoods configured to enable active and independent control of a fluid flow (e.g., an air sample) over at least some of the gas sensors disposed on the primary substrate. Each flow hood (e.g., depicted at 221, 222, 223 and 224) is configured to be disposed on a top surface of at least one of the gas sensors coupled to a gas sensor module on the primary substrate 210. In particular, each flow hood coupled to a gas sensor provides a sealed chamber that allows the pushing or pulling of a fluid (e.g., an air sample) through a controlled volume over the sensor. In some embodiments, the flow hood 221, 222, 223 and 224 may be considered part of the sensor module 201, 202, 203, and 204, respectively.

The fluid enters each flow hood through an input port and leaves each fluid port through an output port. In some cases, a fitting is used at the input and output ports to attach or couple connective tubing that accommodates a flow of the fluid through the manifold. In this manner, the manifold is configured to provide active flow control of a fluid flow by pushing or pulling a fluid across a top surface of a gas sensor through a flow hood disposed on the top surface of the gas sensor. In the case where a plurality of gas sensors are used, the manifold is configured to provide active flow control of a plurality of fluid flows by pushing or pulling a fluid across a top surface of each of a plurality of gas sensors through a flow hood disposed on the top surface of each of the plurality of gas sensors. Additionally, each of the fluid flows across a given gas sensor can be adjusted based at least in part on a type or sensitivity of the given gas sensor.

Certain gases are more reactive than other gases or are present in very small or trace amounts in the acquired air sample. For highly reactive gases such as $NO_2$ and NO, the air sample obtained is conditioned to limit exposure to components that might react with the gas desired to be measured. Accordingly, for these highly reactive gases, the fluid flow (e.g. air sample) is pulled to the gas sensor whereas for a less reactive gas such as $CO_2$, the fluid flow (e.g., air sample) is pushed to the gas sensor.

In some cases, a pump system provides active control of a fluid flow through the manifold and across the face or top surface of each gas sensor. In particular, the pump system is configured to independently either pull or push a fluid sample across the face or top surface of a given gas sensor through a flow hood disposed on the top surface of the given gas sensor. Thus, the fluid sample flows through the manifold via a plurality of flow hoods disposed on the top surface of a plurality of gas sensors, wherein the flow hoods are connected to each other (e.g., via connective tubing and fittings) and to other components to form the manifold.

In some embodiments, the pump system comprises a plurality of pump units, each pump unit having a vacuum side and a pressure side to either pull or push a fluid across a top surface of a gas sensor. For example, to pull a fluid flow across a top surface of a given gas sensor, a pump unit is positioned on a backside of the sensor to draw air towards the sensor from the backside of the sensor. Alternately, to push a fluid flow across a top surface of a given gas sensor, a pump unit is positioned on a front side of the given gas sensor to push or blow air through the manifold towards the gas sensor. In this manner, the system is configured to either push or pull a fluid flow across a top surface of a given gas sensor regardless of the gas sensor's flow order or flow sequence along the manifold.

The configuration of a plurality of flow hoods as described herein, wherein each flow hood is disposed over a gas sensor and connected (e.g., via connective tubing and fittings) to provide a manifold allows for a conditioned air sample to be provided to each gas sensor by limiting the volume of fluid (via the flow hood) that passes over each sensor. This results in a more laminar air flow across a top surface of a sensor as opposed to existing systems that merely allow air to diffuse over the sensor without controlling the amount of air sample or actively controlling the air flow.

Additionally, each flow hood in the manifold is configured to be connected to another component (e.g., a flow hood or a flow meter) on the primary substrate (e.g., via connective tubing (not shown)) that allows for a fluid (e.g., an air sample) to flow through each flow hood in the manifold. Fluid flow is actively and independently controlled by either pushing or pulling the fluid (e.g., via a fluid pump) over a given sensor through the flow hood disposed on a top surface of the given sensor. In the example shown, flow hood 221 is disposed on a top surface of gas sensor 211, flow hood 222 is disposed on a top surface of gas sensor 212, flow hood 223 is disposed on a top surface of gas sensor 213, and flow hood 224 is disposed on a top surface of gas sensor 214. In some cases, the connective tubing is attached via a fitting (e.g., depicted at 232 and 233) coupled to the flow hood. A fitting is also used to attach connective tubing to a fluid input (e.g., depicted at 231) through which a fluid is received into the manifold or a fluid output (not shown) through which a fluid is released from the manifold.

As described above, the flow of fluid is actively controlled by either pushing or pulling the fluid through each flow hood in the manifold. A flow hood is also configured to be connected to another flow hood or to another component on the primary substrate (e.g., via connective tubing attached with fittings to each of the flow hoods). In this manner, system 200 may enable control of a fluid flow over a plurality of gas sensors such that the fluid sample reaches each gas sensor in a selected or particular flow order or flow sequence.

Certain considerations guide how various gas sensors are positioned on the board and the mechanical layout of components on the board. As discussed above, one consideration is whether the gas being measured is highly reactive and requires a conditioned air sample. For example, a pollutant that is highly reactive or unstable in an air sample (e.g., ozone or $NO_2$), the more quickly and cleanly the air sample is provided to the gas sensor, the higher the quality of the measurement. Thus, it is advantageous to pass the air sample first to the gas sensors measuring highly reactive pollutants before the pollutant dissipates or the air sample is exposed to any other components that might react with the pollutant as the air sample flows through the manifold.

To accomplish this result, rather than allowing air to simply diffuse over a sensor, the air sample is provided to selected sensors in a particular order and in a controlled volume via a manifold that provides as little space as possible over the face of the sensor while providing sufficient sample to enable a high quality measurement for accurate testing.

In some cases, the order of the gas sensors on the primary substrate is determined based at least in part on the reactivity of each pollutant to be measured. For example, the gas sensors and manifold are configured in a mechanical layout on the primary substrate such that the fluid flow across a top surface of each gas sensor as determined by the manifold reaches the gas sensors in an order from those measuring the most reactive gases to those measuring the least reactive gases. The air sample is provided as quickly and cleanly as possible to the sensors measuring the most reactive gases that will be more sensitive to the purity of the air sample. By selecting a position of each gas sensor on the primary substrate and by configuring the fluid flow through the manifold through a choice of how each flow hood is connected to other components in the manifold, the system can be used to dictate the flow order or flow sequence of a fluid sample over a series of different gas sensors. Better measurements are obtained by prioritizing or ordering the gas sensors in a hierarchy from those measuring the most reactive to the least reactive pollutants. The system provides active control of the fluid flow via the manifold and based on the application. The system thus accommodates the different natures of certain gases or substances (e.g., different reactivity or sensitivity) by providing a choice of placement of a gas sensor measuring a particular gas in a certain flow order as dictated by the manifold.

As described above, the ability provided by the system of dictating, setting, or establishing a flow order or flow sequence of a fluid sample over a series of different gas sensors provides an advantage in certain applications that require measuring gases that vary in terms of their reactivity or sensitivity, or in the relative amount that they are present in the air sample. In particular, gas sensors for highly reactive or sensitive gases or for gases present in trace amounts are positioned to receive a fluid sample at an earlier point in the flow order or position in the flow sequence, while gas sensors for less reactive or sensitive gases or gases present in relatively large amounts in the fluid sample are positioned to receive the fluid sample at a later time or position in the sequence.

In some embodiments, the manifold is configured to provide a conditioned air sample across a top surface of each of the gas sensors via active control of a fluid flow through each flow hood. Here, in order to obtain a high quality measurement, it is desirable to provide a more laminar flow such that the fluid flows across a face or top surface of the gas sensor in a parallel direction as opposed to flowing in a direction that is perpendicular to the face or top surface of the sensor. To generate or produce a more laminar flow across the face or top surface of the gas sensor, the manifold is configured to provide a small, closed, and controlled volume (e.g., via each flow hood disposed on a top surface of a gas sensor) to ensure the space over each gas sensor through which the fluid flows is as small as possible while still being sufficient to provide an accurate measurement.

Using a pump system, the manifold is also configured to provide independent control of a fluid flow across a top surface of a gas sensor by either pulling or pushing the fluid across a top surface of a given gas sensor, which can be adjusted based on a type or sensitivity of the given gas sensor (e.g., the reactivity of the gas being measured by the given gas sensor). For example, in the case of a sensor for measuring nitrogen dioxide, which is a highly reactive and unstable pollutant, pushing an air sample will cause at least some of the nitrogen dioxide in the air sample to be lost. Accordingly, in this case, the manifold is configured to pull air towards the sensor for measuring nitrogen dioxide, providing the air sample to the nitrogen dioxide sensor before it is exposed to any other components, pumps, or mechanical structures that might compromise the air sample.

Certain gas sensors are also sensitive to a flow rate and direction of flow of a fluid sample. A response of the gas sensor can be dependent on the rate of the fluid flow received across the face of the gas sensor. For example, a fluid that is flowing at a rate of one liter per minute across the face of the gas sensor produces a different response or measurement as compared to a fluid flowing at a rate of half a liter per minute. For this reason, to ensure a consistent set of measurements, a consistent and steady fluid flow may be provided across a gas sensor disposed on the primary substrate.

Accordingly, conditioning the air sample includes ensuring that a consistent and steady flow is provided. Here, the manifold includes a plurality of low flow hoods configured to provide a consistent and steady fluid flow across a gas sensor disposed on the primary substrate. Using this configuration of flow hoods confines the fluid sample to a smaller region that provides a small amount of volume over the sensor that is sufficient for the gas sensor to make a quality measurement and also helps to provide a more laminar flow across the face of the gas sensor. Additionally, the small amount of volume provided by the disclosed flow hoods facilitate measurements of fluid flows that are very low (e.g., as low as half a liter per minute) in contrast to industry standards, which in this case are already set at relatively low flow rate (e.g., two liters per minute). The flow hoods of the disclosed manifold are also configured to minimize the amount of fluid flow needed to pass through the manifold to provide a sufficient amount of sample to the various gas sensors disposed under each flow hood, which is of particular importance in a mobile application where spatial data is critical.

In cases where a consistent and steady flow is advantageous, system 200 may be configured to monitor or measure the fluid flow through the manifold using a flow measurement device such as a flow meter. As shown in FIGS. 2A-2B, the system includes one or more flow meters (e.g., depicted at 225 and 226 respectively) that can be used to measure a flow of fluid through the manifold. In some cases, the system is configured to push or pull a fluid flow from a flow hood disposed on a top surface of a gas sensor to a particular flow meter. The flow meter is configured to measure a flow of fluid. The fluid passed though the flow meter can then be pushed or pulled to a subsequent flow hood disposed on a top surface of another gas sensor. In some embodiments, the pump system is used to control or provide a steady flow of fluid through the manifold.

As shown in FIGS. 2A-2B, the system also includes a plurality of secondary substrates (e.g., depicted at 241, 242, 243, and 244). In this case, each secondary substrate is disposed on a top surface of a flow hood in the manifold. In the example shown, secondary substrate 241 is disposed on a top surface of flow hood 221, secondary substrate 242 is disposed on a top surface of flow hood 222, secondary substrate 243 is disposed on a top surface of flow hood 223, and secondary substrate 244 is disposed on a top surface of flow hood 224. In some instances, each secondary substrate on a given flow hood is configured to capture an environmental metric at a sensor point corresponding to a location of the gas sensor on which the given flow hood is disposed. In some cases, as described in more detail below, the secondary substrate is a printed circuit board configured to provide temperature, pressure, or humidity measurements. In contrast to existing systems that rely on an external probe to measure an environmental metric such as temperature, pressure, or humidity, by using a secondary substrate located at a sensor point, the resulting measurements will be more accurate.

In one embodiment, the gas sensors at 211, 212, and 213 depict a particular type of sensor; the gas sensor at 214 depicts a detector configured to detect or measure volatile organic compounds (VOC); and the gas sensor at 215 depicts a sensor configured to detect or measure carbon dioxide ($CO_2$).

Also depicted in FIGS. 2A-2B is a manifold comprising a plurality of flow hoods configured to enable active and independent control of a fluid flow (e.g., an air sample) over at least some of the gas sensors disposed on the primary substrate 210. Here, each flow hood (e.g., box-shaped components depicted at 221, 222, 223 and 224) are shown in FIG. 2B to be disposed on a top surface of a gas sensor coupled to a gas sensor module on the primary substrate 210. As described above, each flow hood coupled to a gas sensor provides a sealed chamber that allows the pushing or pulling of a fluid (e.g., an air sample) through a controlled volume over the sensor, which provides a more optimally conditioned air sample to the sensor by limiting the volume of fluid (using the flow hood) that passes over each sensor resulting in a more laminar air flow across a top surface of each sensor.

Each flow hood in the manifold is configured to be connected to another flow hood or to another component on the primary substrate (e.g., via connective tubing (not shown) and fittings) that allows for a fluid (e.g., an air sample) to flow through each flow hood in the manifold. In the embodiment shown, fluid flow is actively and independently controlled by either pushing or pulling the fluid (e.g., via a fluid pump) over a given sensor through the flow hood disposed on a top surface of the given sensor.

As shown in FIG. 2B, flow hood 221 is disposed on a top surface of gas sensor 211, flow hood 222 is disposed on a top surface of gas sensor 212, flow hood 223 is disposed on a top surface of gas sensor 213, and flow hood 224 is disposed on a top surface of sensor 214. In some cases, the connective tubing is attached via a fitting (e.g., depicted at 232 and 233) coupled to the flow hood. A fitting is also used to attach connective tubing to a fluid input (e.g., depicted at 231) through which a fluid is received into the manifold or a fluid output (not shown) through which a fluid is released from the manifold. In this manner, the system is configured to enable control of a fluid flow over a plurality of gas sensors such that the fluid sample reaches each gas sensor in a selected or particular flow order or flow sequence.

Additionally, as shown in FIG. 2B, the system includes one or more flow meters (e.g., depicted at 225 and 226 respectively) that can be used to measure a flow of fluid through the manifold. In some cases, the system is configured to push or pull a fluid flow from a flow hood disposed on a top surface of a gas sensor to a particular flow meter. The flow meter is configured to measure a flow of fluid and can be used to ensure a consistent and steady fluid flow through the manifold. The fluid passed though the flow meter can then be pushed or pulled to a subsequent flow hood disposed on a top surface of another gas sensor.

The system also includes a plurality of secondary substrates (e.g., depicted at 241, 242, 243, and 244). In this case, each secondary substrate is disposed on a top surface of a flow hood in the manifold. In the example shown, secondary substrate 241 is disposed on a top surface of flow hood 221, secondary substrate 242 is disposed on a top surface of flow hood 222, secondary substrate 233 is disposed on a top surface of flow hood 223, and secondary substrate 244 is disposed on a top surface of flow hood 224. In some instances, each secondary substrate on a given flow hood is configured to capture an environmental metric at a sensor point corresponding to a location of the gas sensor on which the given flow hood is disposed. In some cases, as described in more detail below, the secondary substrate is a printed circuit board configured to provide temperature, pressure, or humidity measurements. In contrast to existing systems that rely on an external probe to measure an environmental metric such as temperature, pressure, or humidity, by using a secondary substrate located at a sensor point, the resulting measurements will be more accurate.

Although system 200 may provide conditioned air samples to modules 202, 203, 204 and 205, conditions at each module 202, 203, 204 and 205 may vary. For example, there may be local variations in temperature and/or pressure across primary substrate 210. Similarly, humidity or other aspects of the environment may have local variations across the primary substrate 210. As a result, the temperature, pressure, humidity and/or other condition may be different at sensor 213 than at sensors 211, 212, 214 and/or 215. Further, the signal output by sensors 211, 212, 213, 214 and 215 may vary not only in response to the presence of the gas or other substance such sensors are used to detect, but also in response to variations in temperature, pressure, humidity and/or other conditions. In order to improve the accuracy of the measurements of system 200, as well as system 100, such local variations in environment are desired to be accounted for in analyzing data from systems 100 and 200. This may be achieved by combining data from sensors 211, 212, 213, 214 and/or 215 with data from environmental sensors (not shown in FIGS. 2A-2B) that reside on secondary substrates 241, 242, 243 and 244, respectively.

Figure 3:
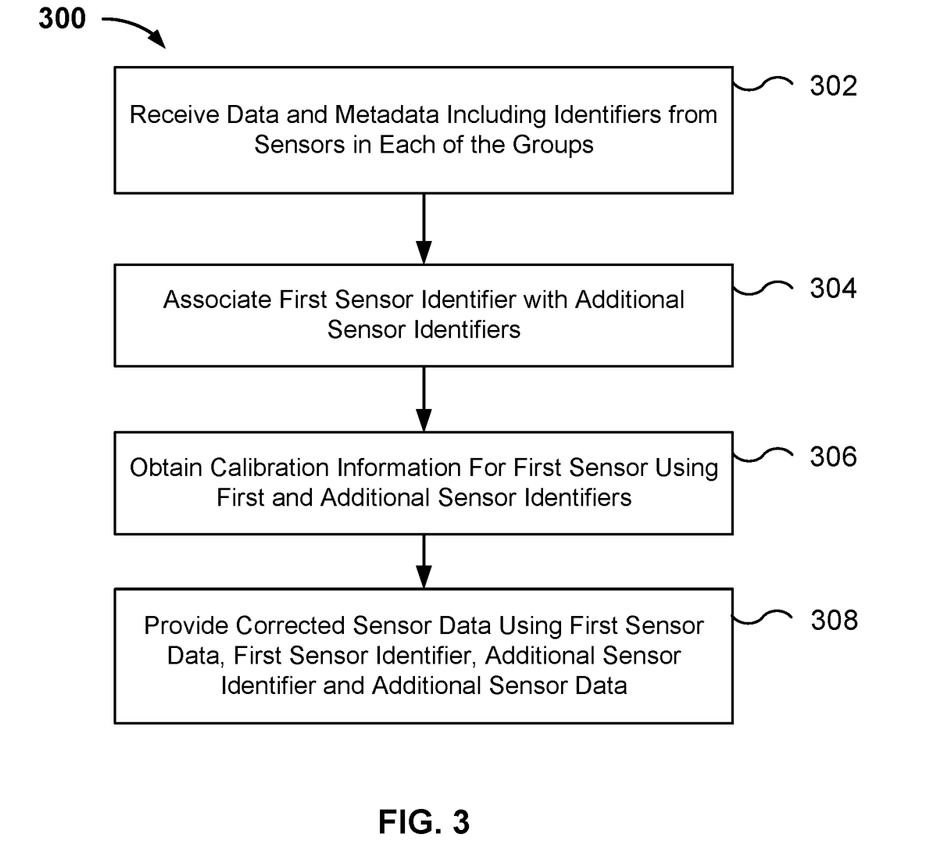
FIG. 3 is a flow chart of an embodiment of a method for processing data from multi-sensor groups.

FIG. 3 is a flow chart depicting an exemplary embodiment of a method 300 for processing data from multi-sensor groups. Method 300 is described in the context of sensor system 102A. However, method 300 functions for other subsystems including but not limited to sensor systems 102B, 102C and 200. Method 300 is also described in the context of group 110 of sensor system 102A. However, method 300 applies to groups 120 and/or 130 of the sensor system 102A.

Data and metadata from first sensor and remaining sensor(s) for each group 110, 120 and 130 are received, at 302. In some embodiments, sensors for each group 110, 120 and 130 sample and send data to processing unit 140 and/or server 150. The sensors in groups 110, 120 and 130 may sample data once every two seconds. In some such embodiments, the data is sampled at least once per second. The sensors in each group 110, 120 and 130 sense the corresponding substance(s) and/or conditions in a volume of air flowing through a hood and provide corresponding sensor data.

Metadata from each sensor includes the identifier for the sensor and, in some embodiments, the time at which the time the data is sampled. For example, the metadata may include a timestamp corresponding to the time at which the data are sampled. As a result, data from a first sensor can be temporally correlated with data from remaining sensor(s). For example, the first sensor 112 may sense $NO_2$ and $O_3$, sensor 114 may be a T/P sensor and sensor 116 may be an $O_3$ sensor. First sensor 112 senses $NO_2$ and $O_3$ at a first time and provides to server 150 (optionally via processing unit 140) the $NO_2/O_3$ data, the first sensor 112 identifier and a first timestamp indicating the first time. Similarly, sensor 114 senses temperature and pressure at the location of the group 110 at a second time. Sensor 114 also provides the temperature and pressure data, sensor 114 identifier and a second time stamp indicating the second time to server 150, optionally via processing unit 140. Sensor 116 senses $O_3$ at the location of the group 110 at a third time. Sensor 116 provides the $O_3$ data, sensor 116 identifier and a third timestamp indicating the third time to server 150, optionally via processing unit 140. The first, second and third times are within two seconds. In some embodiment, the first, second and third times are within one second.

The identifier for the first sensor of each group is associated with the identifiers for one or more remaining sensor(s) in the group, at 304. Consequently, data from sensors in the same group 110, 120 and 130 can be linked such that analysis of data from one sensor in the group can incorporate data from another sensor in the group. In the example above, the first sensor 112 identifier is associated with the sensor 114 identifier and, in some embodiments, the sensor 116 identifier. In some embodiments, the sensor 116 identifier is also associated with the sensor 114 identifier. In some embodiments, 304 may include storing this association in calibration tables 154, for example upon fabrication of sensor platform 102A. In some such embodiments, 304 also includes searching calibration tables 154 for sensor identifier(s) 112, 114 and/or 116 on the fly to determine the remaining, associated sensor(s) 114 and/or 116 in the group.

Calibration information for the first sensor in each group is obtained based on the first sensor identifier and the additional sensor identifier(s) for the sensors in each group 110, 120 and 130, at 306. In some embodiments, 306 includes using information in the calibration table(s) 154 to obtain the appropriate corrections. Calibration table(s) 154 may store the calibration information in addition to the associated sensor identifiers. In other embodiments, calibration table(s) may include pointers or other mechanisms indicating the location and/or substance of the calibration information.

Calibration information may include corrections based on data obtained via a calibration of the first sensor. For example, a signal from a first sensor indicating the presence and amount of a particular substance may change based not on variations in the amount of the substance, but on differences in pressure, temperature, and/or humidity. Calibration information can be used to provide corrections for pressure, temperature and/or humidity to first sensor data and improve the accuracy of detection of substances of interest. In some embodiments, calibration information is a function based on environmental factors such as temperature and pressure that correct the output of a particular sensor. In such embodiments, the pressure, temperature and/or other data from an environmental sensor is input to the function along with the sensor data from the sensor associated with the environmental sensor. The output of the function is the corrected sensor data. In other embodiments, calibration information may be a table of values indicating sensor data for various temperatures, pressures, humidities and concentrations of the relevant substance. This table may be interpolated to provide corrected sensor data. Other mechanisms, including but not limited to coefficients to be multiplied with data in appropriate ranges, may be utilized to obtain corrected sensor data from the calibration information. For multi-modality sensors, calibration information may include corrections for one or more of the substances detected by the multi-modality sensor and be based on data from other sensor(s) in the group. This calibration information allows one or more of the substances detected by the multi-modality sensor to be removed from the sensor data. Thus, particular substances may be isolated. Multi-modality sensors may also have corresponding calibration information to account for variations in pressure, temperature and/or humidity as described above.

Corrected first sensor data is provided for each of the groups 110, 120 and 130 using the calibration information for the first sensor, at 308. Corrected first sensor data may be output to server 150, optionally via processing unit 140. The correction may be a multiplicative factor, a subtraction for example for an offset, or other modification to the first sensor data based on the calibration information. The corrected first sensor data may account for variations in temperature, pressure, humidity and/or other environmental conditions. In some embodiments, the corrected first sensor data may have a single constituent extracted from a multi-modality sensor.

For example, first sensor 112 may be a CO sensor, which can be sensitive to temperature and/or pressure. Sensor 114 may be a temperature and/or pressure sensor. Sensor 112 provides to server 150 its CO data, its sensor 112 identifier and, optionally, a first time at which the CO data were sampled. In some embodiments, this may be accomplished by sending a message incorporating the sensor 114 identifier and CO data to server 150. Sensor 114 provides to server 150, temperature and/or pressure data, sensor 114 identifier and, optionally, a second time at which sensor 114 sampled the temperature and pressure. In some embodiments, this may be achieved by sending a message including sensor 114 identifier and temperature and pressure data to server 150. At 302, server 150 receives the identifiers and data from sensors 112 and 114. Server 150 associates sensor 112 identifier with sensor 114 identifier at 304. This may include searching the calibration table for sensor 112 identifier and determining that sensor 114 is associated with sensor 112. Calibration information for sensor 112 is obtained by server 150 at 306. This calibration information is specific to sensor 112 and utilizes data from associated sensor 114. Thus, accurate, individualized calibration data specifically for sensor 112 is used. Data from another sensor in the group that is exposed to the same environmental conditions are also used in the correction. Using data from sensors 112 and 114, a correction to the CO levels is determined based on the data output by sensor 112, the local temperature and pressure sensed by sensor 114, and the individualized calibration of sensor 112. Server 150 corrects the CO data using this calibration information, at 308. Because the calibration information is specific to sensor 112, as opposed to a class of CO sensors analogous to sensor 112, and because the environmental data is specific to sensor 112, as opposed to the board 104 in general, a more accurate determination of the presence and amount of CO in an air sample can be obtained. Using method 300, therefore, more accurate air quality data can be obtained from sensor platforms 100 and 200.

Figure 4:
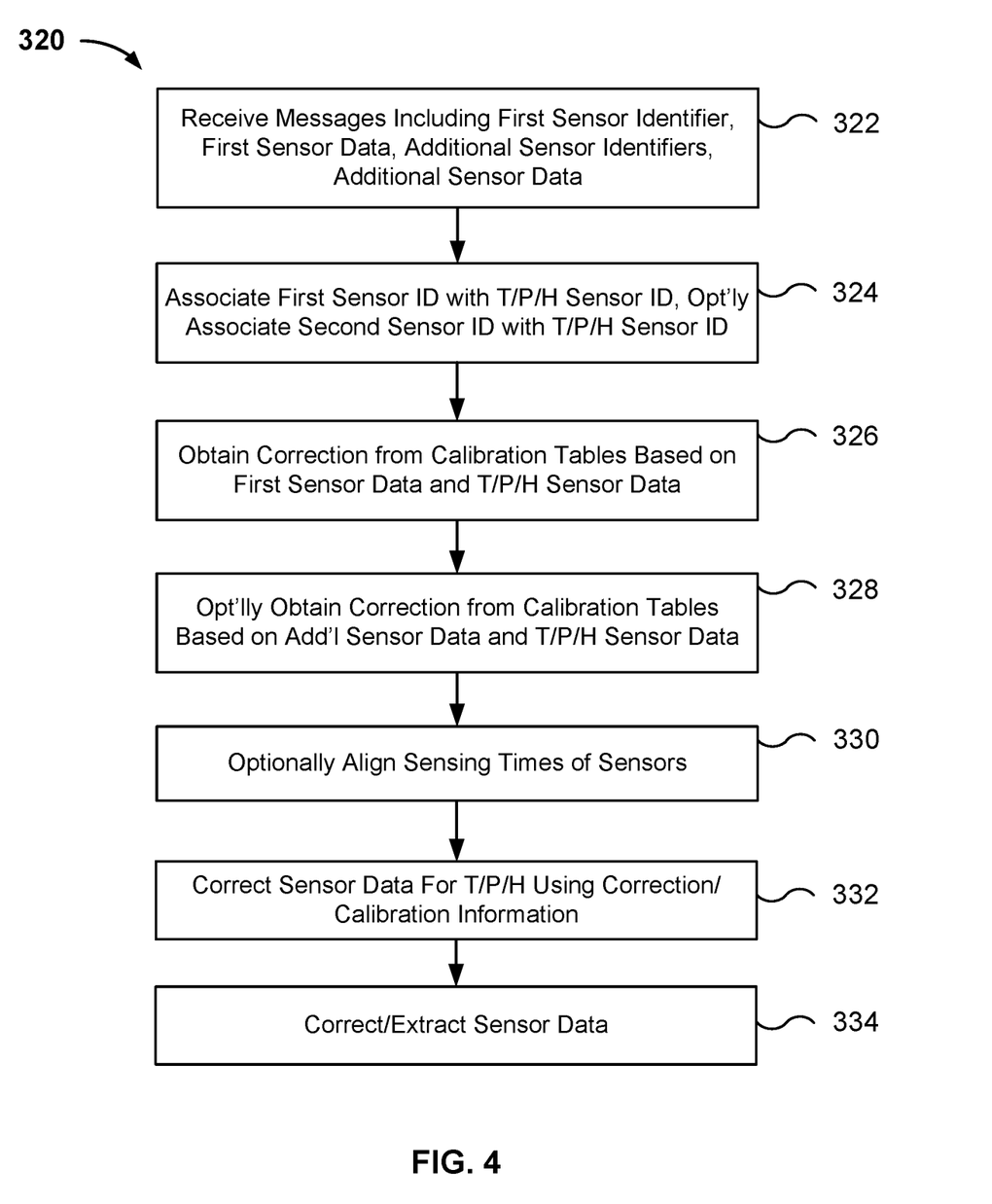
FIG. 4 is a flow chart of an embodiment of a method for processing data from multi-sensor groups including co-located sensors.

FIG. 4 is a flow chart depicting an exemplary embodiment of a method 320 for processing data from multi-sensor groups. Method 320 is described in the context of sensor system 102A. However, method 320 functions for other subsystems including but not limited to sensor systems 102B, 102C and 200. Method 320 is also described in the context of group 110 of sensor system 102A. However, method 320 applies to groups 120 and/or 130 of the sensor system 102A.

Figure 5:
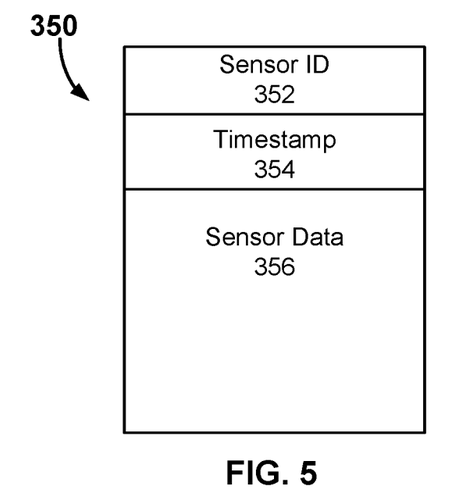
FIG. 5 is a diagram of an embodiment of a message packet.

Messages including sensor identifiers, sensing times, and sensor data are received by server 150 from sensors 112, 114 and 116, sensors 122, 124 and 126 and sensors 132 and 134, at 322. FIG. 5 depicts one embodiment of a message 350 that may be received from the sensors of groups 110, 120 and/or 130. Message 350 includes a sensor identifier, timestamp 354 and sensor data 356. The sensor identifier 352 and timestamp 354 may be included in a header for message 350. Sensor data 356 may be carried as payload. The timestamp 354 indicates the time at which sensor data 356 was sampled by the corresponding sensor. Timestamps 354 for sensors within the same group may not be identical but are desired to be within two seconds and, in some embodiments, within one second. Using identifiers 322 in each message 350 from each sensor 112, 114, 116, 122, 124, 126 132 and 134 can be distinguished.

The identifiers for the first sensor of each group are associated with the identifiers for one or more remaining sensors in the group, at 324. For example, identifiers for environmental sensors that measure temperature, pressure and/or humidity are associated with the first sensors. As a result, data for sensors within a group 110, 120 and 130 can be correlated. 324 may include looking up the identifiers for sensors 112, 122 and 132 in calibration tables 154 to determine that environmental sensor 114 and additional sensor 116 are associated with sensor 112, that environmental sensor 124 and additional sensor 126 are associated with sensor 122 and that environmental sensor 134 is associated with sensor 132. Consequently, data from sensors in the same group 110, 120 and 130 can be linked such that analysis of data from one sensor in the group can incorporate data from another sensor in the group. Thus, sensors that are exposed to substantially the same conditions, such as temperature, pressure and/or relatively humidity, are associated. As discussed above, the association at 324 may include formation of the calibration tables 154 upon fabrication of the sensor platforms 104 as well as search of the calibration tables 154.

Calibration information for the first sensor in each group is obtained based on the first sensor identifier and the additional sensor identifier(s), sensor data and environmental data for each group 110, 120 and 130, at 326. In some embodiments, 326 includes using the appropriate information in calibration table(s) 154 to obtain the desired correction mechanism for temperature, pressure, humidity and/or other environmental factors. Analogous calibration information for any additional sensors, such as sensor 116, may optionally be obtained in a similar manner at 328.

The sensing times of the first sensor and other sensor(s) may be aligned, at 328. In some embodiments, the timestamp 354 may be used at 328. Timestamp 354 indicates the time at which the sensor from which message 350 originated performed the measurement. Although timestamps from sensors in the same group are close, in some instances the timestamps are not sufficiently close to correct data. For example, if the timestamps 354 for two messages 350 from two sensors in a group are within one second, alignment may be unnecessary. However, if the time stamps differ by more than two seconds, alignment may be desired. Similarly, a multi-modality sensor measuring two constituents may provide data that exhibits features consistent with a first constituent. Data for another sensor in the same group that measures the first constituent may exhibit analogous features at a different time. In such a case, the features for the multi-modality sensor and first constituent sensor are temporally aligned. Thus, the data may be aligned using a correction factor based upon the time and/or features in the data.

Corrected sensor data is provided for sensors in each of the groups 110, 120 and 130 using the calibration information for at least some environmental factors, at 330. Thus, variations in output of sensors based on environmental factors such as temperature, pressure, and/or humidity may be accounted for. For some sensors, method 320 terminates at 330. For multi-modality sensors for which certain data are desired to be isolated, the sensor data may also be corrected/extracted at 332. For example, sensor data for one sensor that has been corrected for certain environmental factors may be subtracted from corrected sensor data for a multi-modality sensor that has also been corrected for environmental factors. Thus, one or more substances may be isolated using multi-modality and other sensors.

For example, first sensor 112 may be an $NO_2/O_3$ multi-modality sensor, sensor 114 may be a T/P sensor and sensor 116 may be an $O_3$ sensor. First sensor 112 senses $NO_2$ and $O_3$ at a first time and provides to server 150, the $NO_2/O_3$ data, the first sensor 112 identifier and a first timestamp indicating the first time. Sensor 114 senses temperature and pressure at the location of the group 110 at a second time. Sensor 114 provides the temperature and pressure data, sensor 114 identifier and a second time stamp indicating the second time to server 150. Sensor 116 senses $O_3$ at the location of the group 110 at a third time. Sensor 116 provides the $O_3$ data, sensor 116 identifier and a third timestamp indicating the third time to server 150. Thus, the $NO_2/O_3$, temperature, pressure and $O_3$ data, along with sensor identifiers, are received by server 150 at 322.

Server 150 associates the first sensor 112 identifier with sensor 114 identifier, via 324. In some embodiments, first sensor 112 identifier is also associated with sensor 116 identifier. Further, sensor 116 identifier may be associated with sensor 114 identifier. This may be accomplished by searching calibration table 154 for the identifiers for one or more of sensors 112, 114 and 116. Calibration table indicates that these sensors 112, 114 and 116 are part of the same group 110 such that data from sensors 112, 114 and 116 are used together. For example, calibration table 154 may indicate that data from sensor 114 is used to correct data from sensors 112 and 116 for temperature and pressure, while data from sensor 116 may be used to remove $O_3$ data from data from sensor 112. Corrections are obtained for the first sensor based on the identifiers and the appropriate data at 326. The corrections are based on individual calibrations performed for the sensor. Thus, data from the same region and from sensors subject to the same local conditions as well as calibrations of the individual sensor can be used in correcting data for the sensor. Similarly, corrections are optionally obtained for other sensor(s) in the group at 328.

The data from sensors 112 and 116 may be aligned at 330. For example supposed data from sensor 112 includes a first set of peaks for $O_3$ at a particular time. At a later time, sensor 116 indicates a second set of analogous peaks for $O_3$. Data for sensor 116 may be time shifted such that the first set of peaks for sensor 112 are aligned with the second set of peaks for sensor 116. In some embodiments, data for sensor 114 may be temporally aligned with data for sensors 112 and/or 116 to ensure that the appropriate temperature, pressure and, optionally, humidity are being used for corrections. In some embodiments, such an alignment is performed only if the second timestamp for sensor 114 is greater than a threshold amount, such as two seconds, from the first and/or second timestamps for sensors 112 and/or 116.

The data for sensors 112 and 116 may be corrected for temperature, pressure and, optionally, humidity at 332. This correction may be achieved via a coefficient, function or other mechanism obtained at 326 and/or 328. Thus, variations in individual $NO_2/O_3$ and $O_3$ sensors 112 and 116, respectively, may be accounted for. This accounting not only uses individualized calibration, but also data from the local area of the sensor 112 and 116. $NO_2$ data from sensor 112 may be provided separately from $O_3$ data from sensor 112 or 116 at 332. This is accomplished by subtracting the corrected, aligned data of sensor 116 from the corrected, aligned data of sensor 112. Thus, more accurate determination of the presence and amount of $NO_2$ alone, $O_3$ alone, and/or a combination of $NO_2/O_3$ can be made.

Method 320 uses individual calibrations of specific sensors in combination with environmental data from the local region of the sensor. Using method 320, therefore, more accurate air quality data can be obtained from sensor platforms 100 and 200.

Figure 6:
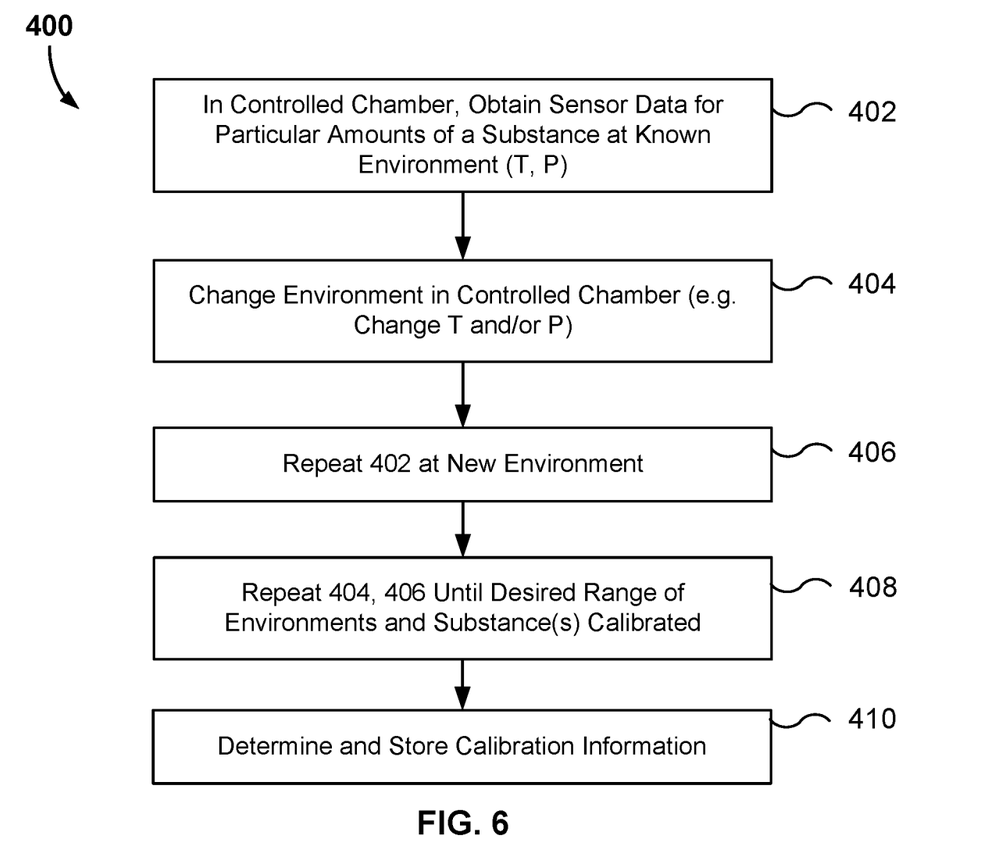
FIG. 6 is a diagram of a method for calibrating a sensor.

FIG. 6 is a flow chart depicting an exemplary embodiment of method 400 for obtaining calibration information for a sensor. Method 400 is described in the context of sensor 112. However, method 400 functions for other sensors including but not limited to sensors 114, 116, 122, 124, 126, 132, 134, 211, 212, 213, 214 and/or 215. In the embodiment shown, calibration information is obtained for variations in temperature and pressure. However, method 400 may be extended to other factors for which output data from sensors vary based not upon the amount of the desired substance being sensed.

Sensor 112 is placed in a controlled chamber and tested for particular amounts of a desired substance at a known temperatures and a known pressure, at 402. For example, a particular concentration of a gas or other substance to which the sensor 112 is sensitive is placed in the chamber with sensor 112. Data are collected for sensor 112. The amount of the substance is then altered and the measurement repeated. This process is repeated at 402 until the desired range of substance concentrations has been measured. The temperature and/or pressure in the chamber are modified, at 404. For example, the temperature may be elevated by heating and/or the pressure may be changed by introducing a noble gas. In some embodiments, only one factor (i.e. temperature or pressure but not both) is changed at 404. The measurement process of 402 is repeated at 406. 404 (changing the environment) and 406 (perform measurements with sensor at different concentrations of substance) are repeated, at 408. Thus, the behavior of the sensor with respect to different pressures, temperatures and concentrations of the substance are known. The calibration information is determined and stored, at 410. For example, a correction factor which may be piece-wise linear or follow another pattern, a function, or a table of correction values and ranges may be determined and stored at 410. Method 400 may be repeated for other constituents (for a multi-modality sensor) and other sensors.

Thus, calibration information for the sensor may be determined. This information may be utilized in sensor systems 100 and 200 and methods 300 and 320 to provide more accurate sensor data.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A method processing signals from a plurality of groups of sensors, each group including a first sensor and at least one additional sensor, the method comprising:
   receiving, from each of the plurality of groups, a message packet from the first sensor and an additional message packet from each of the at least one additional sensor, the first sensor and the at least one additional sensor of each group being co-located, wherein the message packet includes a first sensor identifier and first sensor data from the first sensor, and wherein the additional message packet includes at least one additional sensor identifier and sensor data from a corresponding one of the at least one additional sensor;
   associating the first sensor data identifier with the at least one additional sensor identifier for each of the plurality of groups;
   obtaining calibration information for the first sensor based on the first sensor identifier and the at least one additional sensor identifier, the calibration information being specific to the first sensor having the first sensor identifier, wherein the obtaining of the calibration information comprises:
      determining a correction for the first sensor of each of the plurality of groups using a calibration table, at least one additional sensor identifier and the additional sensor data from the at least one additional sensor associated with the first sensor;
   obtaining additional calibration information for the at least one additional sensor based on at least one additional sensor identifier, the additional calibration information being specific to the at least one additional sensor having the at least one additional sensor identifier, wherein the obtaining of the additional calibration information comprises:
      determining an additional correction for the at least one additional sensor of each of the plurality of groups using the calibration table, at least one additional sensor identifier and the additional sensor data from the at least one additional sensor associated with the first sensor; and
   providing corrected first sensor data and corrected additional sensor data for each of the plurality of groups based on the first sensor data, the additional sensor data, the additional calibration information for the at least one additional sensor, and the data and calibration information for the first sensor, comprising:
      applying the correction to the first sensor data for each of the plurality of groups to obtain the corrected first sensor data; and
      applying the additional correction to the additional sensor data for each of the plurality of groups to obtain the corrected additional sensor data.

2. The method of claim 1, wherein the at least one additional sensor data includes temperature data and pressure data and wherein the calibration table correlates first sensor data with temperature and pressure.

3. The method of claim 2, wherein the at least one additional sensor data includes humidity data and wherein the calibration table further correlates first sensor data with humidity.

4. The method of claim 1, wherein the message packet includes a first sensor sensing time and the additional message packet includes an additional sensor sensing time.

5. The method of claim 4, wherein the first sensor includes a multi-modality sensor for a first feature and a second feature such that first sensor data includes first feature data and second feature data, wherein the at least one additional sensor includes a second feature sensor, and wherein the applying of the correction further includes:
   aligning the first sensor sensing time with the additional sensor sensing time for the second feature sensor; and
   extracting the first feature data from the first sensor data using second feature data from the second feature sensor in the additional sensor data.

6. The method of claim 1 wherein the message packet for the first sensor and the additional message packet for the at least one additional sensor for each of the plurality of groups is received via a single message bus.

7. A system for processing data for a plurality of groups of sensors, each group including a first sensor and at least one additional sensor, the system comprising:
a processor configured to:
receive, from each of the plurality of groups, a message packet from the first sensor and an additional message packet from each of the at least one additional sensor, the first sensor and the at least one additional sensor of each group being co-located, wherein the message packet includes a first sensor identifier and first sensor data from the first sensor, and wherein the additional message packet includes at least one additional sensor identifier and sensor data from a corresponding one of the at least one additional sensor;
associate the first sensor data identifier with the at least one additional sensor identifier;
obtain calibration information for the first sensor based on the first sensor identifier and the at least one additional sensor identifier, the calibration information being specific to the first sensor having the first sensor identifier, wherein the obtaining of the calibration information comprises to:
determine a correction for the first sensor of each of the plurality of groups using a calibration table, at least one additional sensor identifier and the additional sensor data from the at least one additional sensor associated with the first sensor;
obtain additional calibration information for the at least one additional sensor based on at least one additional sensor identifier, the additional calibration information being specific to the at least one additional sensor having the at least one additional sensor identifier, wherein the obtaining of the additional calibration information comprises to:
determine an additional correction for the at least one additional sensor of each of the plurality of groups using the calibration table, at least one additional sensor identifier and the additional sensor data from the at least one additional sensor associated with the first sensor; and
provide corrected first sensor data and corrected additional sensor data for each of the plurality of groups based on the first sensor data, the additional sensor data, the additional calibration information for the at least one additional sensor, and the calibration information for the first sensor, comprising to:
apply the correction to the first sensor data for each of the plurality of groups to obtain the corrected first sensor data; and
apply the additional correction to the additional sensor data for each of the plurality of groups to obtain the corrected additional sensor data; and
a memory coupled to the processor and configured to provide the processor with instructions.

8. The system of claim 7, wherein the at least one additional sensor data includes temperature data and pressure data and wherein the calibration table correlates first sensor data with temperature and pressure.

9. The system of claim 8, wherein the at least one additional sensor data includes humidity data and wherein the calibration table further correlates first sensor data with humidity.

10. The system of claim 7 wherein the message packet includes a first sensor sensing time and the additional message packet includes an additional sensor sensing time.

11. The system of claim 10, wherein the first sensor includes a multi-modality sensor for a first feature and a second feature such that first sensor data includes first feature data and second feature data, wherein the at least one additional sensor includes a second feature sensor, and wherein to apply the correction, the processor is further configured to:
align first sensor sensing time with the additional sensor sensing time for the second feature sensor; and
extract the first feature data from the first sensor data using second feature data from the second feature sensor in the additional sensor data.

12. The system of claim 11 wherein the message packet for the first sensor and the additional message packet for the at least one additional sensor for each of the plurality of groups is received via a single message bus.

13. A computer program product for processing signals from a plurality of groups of sensors, each group including a first sensor and at least one additional sensor, the computer program product being embodied in a tangible non-transitory computer readable storage medium and comprising computer instructions for:
receiving, from each of the plurality of groups, a message packet from the first sensor and an additional message packet from each of the at least one additional sensor, the first sensor and the at least one additional sensor of each group being co-located, wherein the message packet includes a first sensor identifier and first sensor data from the first sensor, and wherein the additional message packet includes at least one additional sensor identifier and sensor data from a corresponding one of the at least one additional sensor;
associating the first sensor data identifier with the at least one additional sensor identifier for each of the plurality of groups;
obtaining calibration information for the first sensor based on the first sensor identifier and the at least one additional sensor identifier, the calibration information being specific to the first sensor having the first sensor identifier, wherein the obtaining of the calibration information comprises:
determining a correction for the first sensor of each of the plurality of groups using a calibration table, at least one additional sensor identifier and the additional sensor data from the at least one additional sensor associated with the first sensor;
obtaining additional calibration information for the at least one additional sensor based on at least one additional sensor identifier, the additional calibration information being specific to the at least one additional sensor having the at least one additional sensor identifier, wherein the obtaining of the additional calibration information comprises:
determining an additional correction for the at least one additional sensor of each of the plurality of groups using the calibration table, at least one additional sensor identifier and the additional sensor data from the at least one additional sensor associated with the first sensor; and
providing corrected first sensor data and corrected additional sensor data for each of the plurality of groups based on the first sensor data, the additional sensor data, the additional calibration information for the at least one additional sensor, and the calibration information for the first sensor, comprising:
  applying the correction to the first sensor data for each of the plurality of groups to obtain the corrected first sensor data; and
  applying the additional correction to the additional sensor data for each of the plurality of groups to obtain the corrected additional sensor data.

14. The computer program product of claim 13, wherein the at least one additional sensor data includes temperature data and pressure data and wherein the calibration table correlates first sensor data with temperature and pressure.

15. The computer program product of claim 13, wherein the message packet includes a first sensor sensing time and the additional message packet includes an additional sensor sensing time.

16. The computer program product of claim 15, wherein the first sensor includes a multi-modality sensor for a first feature and a second feature such that first sensor data includes first feature data and second feature data, wherein the at least one additional sensor includes a second feature sensor, and wherein the instructions for applying the correction further include instructions for:
  aligning first sensor sensing time with the additional sensor sensing time for the second feature sensor; and
  extracting the first feature data from the first sensor data using second feature data from the second feature sensor in the additional sensor data.

\* \* \* \* \*